(12) United States Patent
Seguine

(10) Patent No.: US 8,907,738 B1
(45) Date of Patent: Dec. 9, 2014

(54) SUPPRESSED CARRIER HARMONIC AMPLITUDE MODULATOR

(71) Applicant: Cypress Semiconductor Corporation, San Jose, CA (US)

(72) Inventor: Dennis R Seguine, Temecula, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 30 days.

(21) Appl. No.: 13/802,665

(22) Filed: Mar. 13, 2013

Related U.S. Application Data

(60) Provisional application No. 61/662,763, filed on Jun. 21, 2012.

(51) Int. Cl.
*H03C 1/02* (2006.01)

(52) U.S. Cl.
CPC ........................ *H03C 1/02* (2013.01)
USPC ........................... 332/151; 332/115

(58) Field of Classification Search
USPC ................................................ 332/151, 115
See application file for complete search history.

(56) References Cited

U.S. PATENT DOCUMENTS

| | | | |
|---|---|---|---|
| 4,646,173 | A | 2/1987 | Kammeyer |
| 5,507,456 | A | 4/1996 | Brown |
| 5,563,906 | A | 10/1996 | Hershey |
| 6,373,336 | B1 | 4/2002 | Anderskouv |
| 6,433,835 | B1 | 8/2002 | Hartson |
| 6,621,357 | B2 | 9/2003 | Busch-sorensen |
| 8,267,851 | B1 | 9/2012 | Kroll |
| 2011/0050319 | A1 | 3/2011 | Wong |

FOREIGN PATENT DOCUMENTS

| | | |
|---|---|---|
| EP | 1068666 B1 | 5/2003 |
| EP | 2136468 B1 | 6/2012 |
| WO | WO03013089 A2 | 2/2003 |

OTHER PUBLICATIONS

AN67391—PSoC® 1—Low Distortion FSKGenerator, by Dennis Seguine, Mar. 2, 2011.

*Primary Examiner* — Joseph Chang

(57) ABSTRACT

A circuit includes a switched modulator stage combining an information signal with a square wave carrier to produce a first modulated signal; and a second modulation stage forming additional steps in the first modulated signal to produce a second modulated signal.

20 Claims, 16 Drawing Sheets

SUPPRESSED CARRIER HARMONIC AMPLITUDE MODULATOR

PRIORITY CLAIM

The present application claims priority under 35 USC 119 to U.S. 61/662,763, filed on Jun. 21, 2012, which is incorporated by reference herein in its entirety.

BACKGROUND

Amplitude modulation of signals involves multiplying a signal $Vs*\sin(2\pi f_{SIGNAL}t)$ and a carrier $\sin(2\pi f_{CARRIER}t)$. The carrier term is unitless and not nominally a voltage. An analog multiplier may be used to form $V_{s*sin}(2\pi f_{SIGNAL}t)*\sin(2\pi f_{CARRIER}t)$. This results in modulated terms $Vs/2[\cos(2\pi(f_{CARRIER}-f_{SIGNAL})t)-\cos(2\pi(f_{CARRIER}+f_{SIGNAL})t)]$. If the signal is centered at ground (or some ground-like reference) the result is a double-sideband, suppressed-carrier signal. If the signal is centered at some DC voltage, then there is an additional carrier term and the result is amplitude modulation as for example used with AM radio. This approach is not commonly used because analog multipliers at common frequencies are difficult to construct.

One known method of making a suppressed-carrier AM modulator employs a ring modulator (FIG. 1). The signal (Signal In), carrier local oscillator (Carrier LO), and output RF Out are transformer coupled (e.g., via input and output windings 103 and 105, respectively), resulting in zero DC in the output RF Out. There is suppression of carrier terms, but not carrier harmonics. The ring diodes 104 act non-linearly to multiply signal and carrier, resulting in generation of output signals at odd multiples of the carrier.

Another known method of producing AM modulators in the switched current circuit (FIG. 2). This circuit consists of an upper quad current switch 202 supplied by a voltage source 206, and driven by a lower differential amplifier 204 emitter coupled to a current source (Ibias). A full-wave balanced multiplication of the two input voltages (Carrier and Signal In) occurs. That is, the output signal RF Out is a constant times the product of the two input signals Carrier LO and Signal In. This circuit is typically terminated with a differential transformer or resistive pull-ups and a differential amplifier. DC bias on one or other of the signal inputs results in lack of suppression of the carrier. If the signal input is transformer-coupled and suitably biased, the amount of carrier feedthrough is determined by the mismatch of the signal transistor pair (204), represented by an offset voltage. The upper transistor pairs 202 are switching devices, not analog-multiplying devices. Thus, they do not multiply by a pure carrier signal, but rather by a square wave. In the same way as the ring modulator (FIG. 1), the multiplication of the signal with a switching carrier results in alias terms at odd multiples of the carrier.

An analog CMOS switching circuit is illustrated in FIG. 3. When the carrier is high, the switch 306 is closed and the amplifier 302 multiplies by −1. When the carrier is low, the switch 306 is open and the amplifier 306 multiplies the input Vin by +1 to produce the modulated output signal Vmod-out. Like the ring modulator and the current-switched (bipolar) circuit, this switched amplifier results in carrier terms at odd multiples of the carrier frequency. The resistors 304 may be balanced (i.e., substantially equal in resistive value). Example carrier and modulated output signals in both the time and frequency domains are illustrated in FIGS. 4 and 5.

A disadvantage of all of the previous methods is generation of replicas of the modulated signal at harmonics of the carrier. The output of the modulator has desired components at the carrier plus and minus the signal frequency, then at carrier harmonics plus and minus the signal frequency until the circuit runs out of bandwidth. The carrier is represented by the series given by (1) in Table 1, below. The balanced modulator outputs a signal approximated by the product given in (2) of Table 1. The level of the harmonics is proportional to the inverse of the harmonic number. The third harmonic level is ⅓ times the fundamental or −10 dB. The fifth harmonic level is ⅕ of the fundamental or −14 dB, and so on (see for example FIG. 5). In order to significantly reduce unwanted signals spilling over into adjacent bands, these harmonics must be significantly attenuated. In RF circuits, this is done with filtering. In the case of the ring modulator (FIG. 1), the output transformer may be tuned. In the case of the current switched circuit (FIG. 2) or the voltage switched circuit (FIG. 3), this means that an additional filter stage is required. This may necessitate the use of additional active and passive components or a complex passive (tuned LC) filter.

BRIEF DESCRIPTION OF THE DRAWINGS

In the drawings, the same reference numbers and acronyms identify elements or acts with the same or similar functionality for ease of understanding and convenience. To easily identify the discussion of any particular element or act, the most significant digit or digits in a reference number refer to the figure number in which that element is first introduced.

DETAILED DESCRIPTION

Preliminaries

Figure 1:
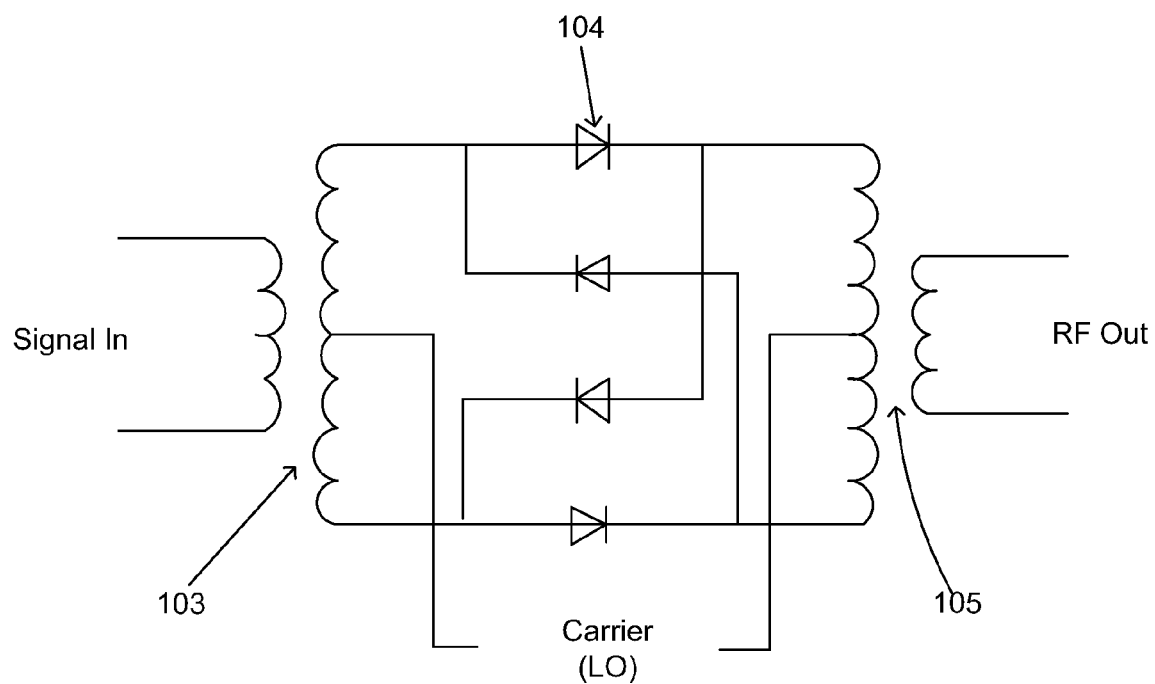
FIG. 1 is an illustration of an AM suppressed carrier ring modulator.
Figure 2:
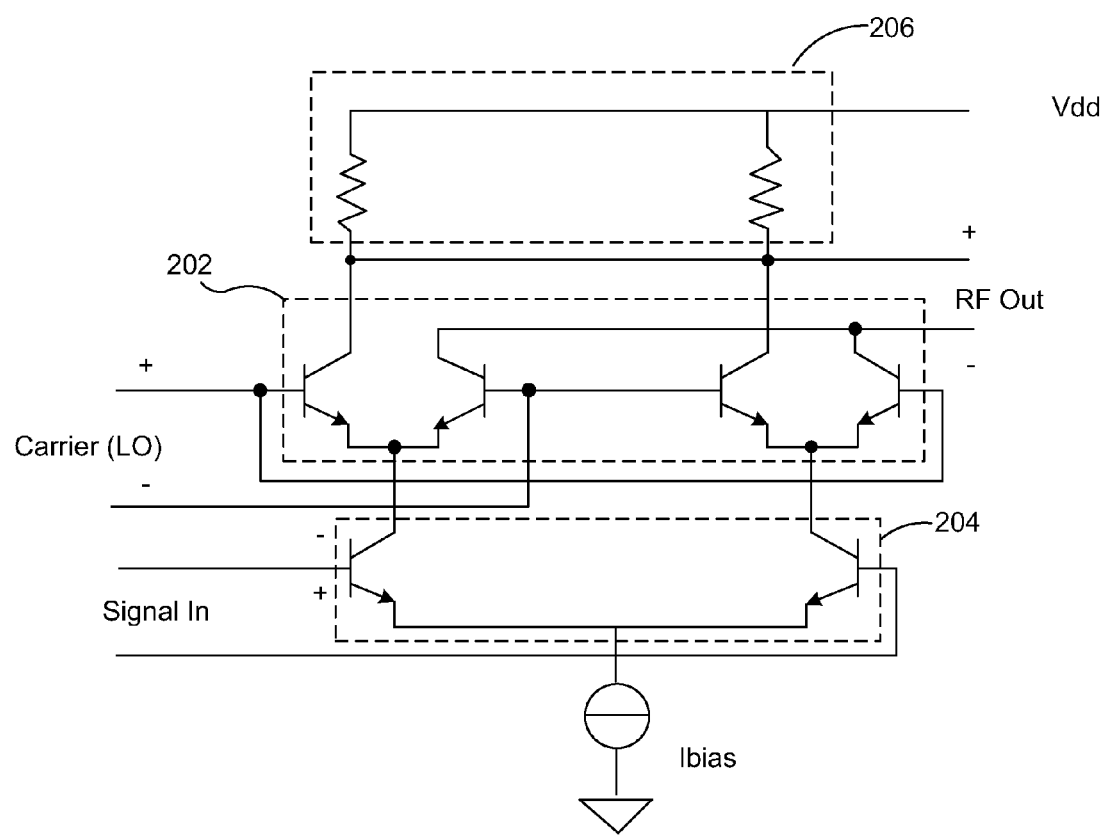
FIG. 2 is an illustration of a switched current circuit.
Figure 3:
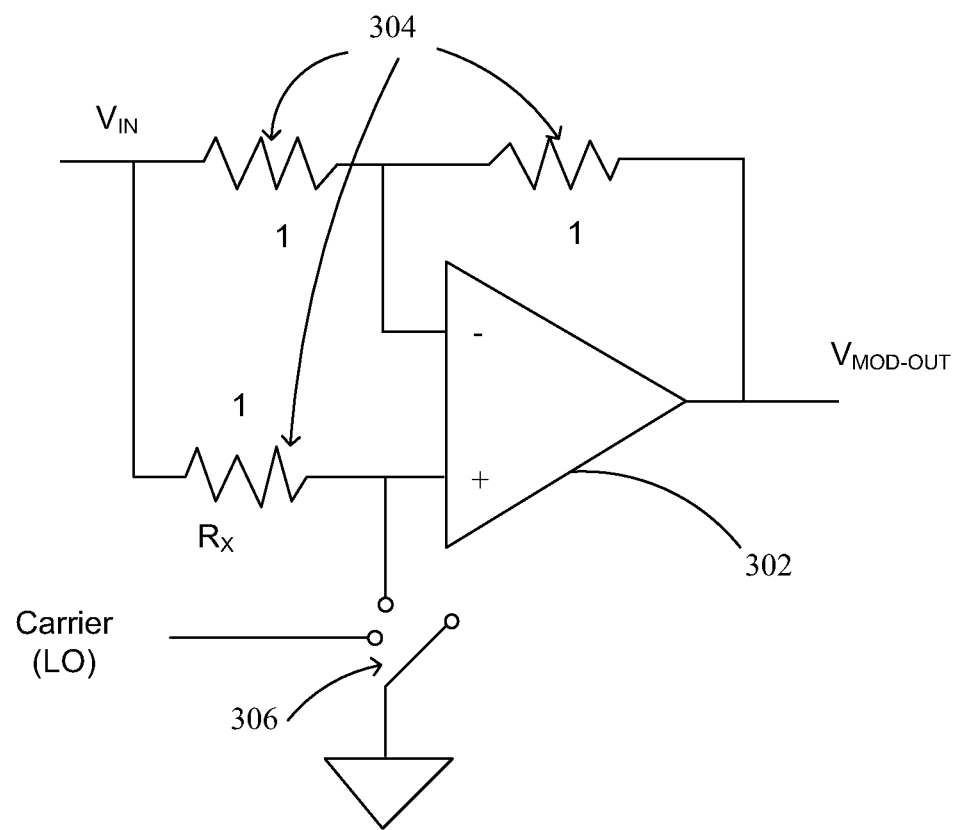
FIG. 3 is an illustration of an analog CMOS switching circuit.
Figure 4:
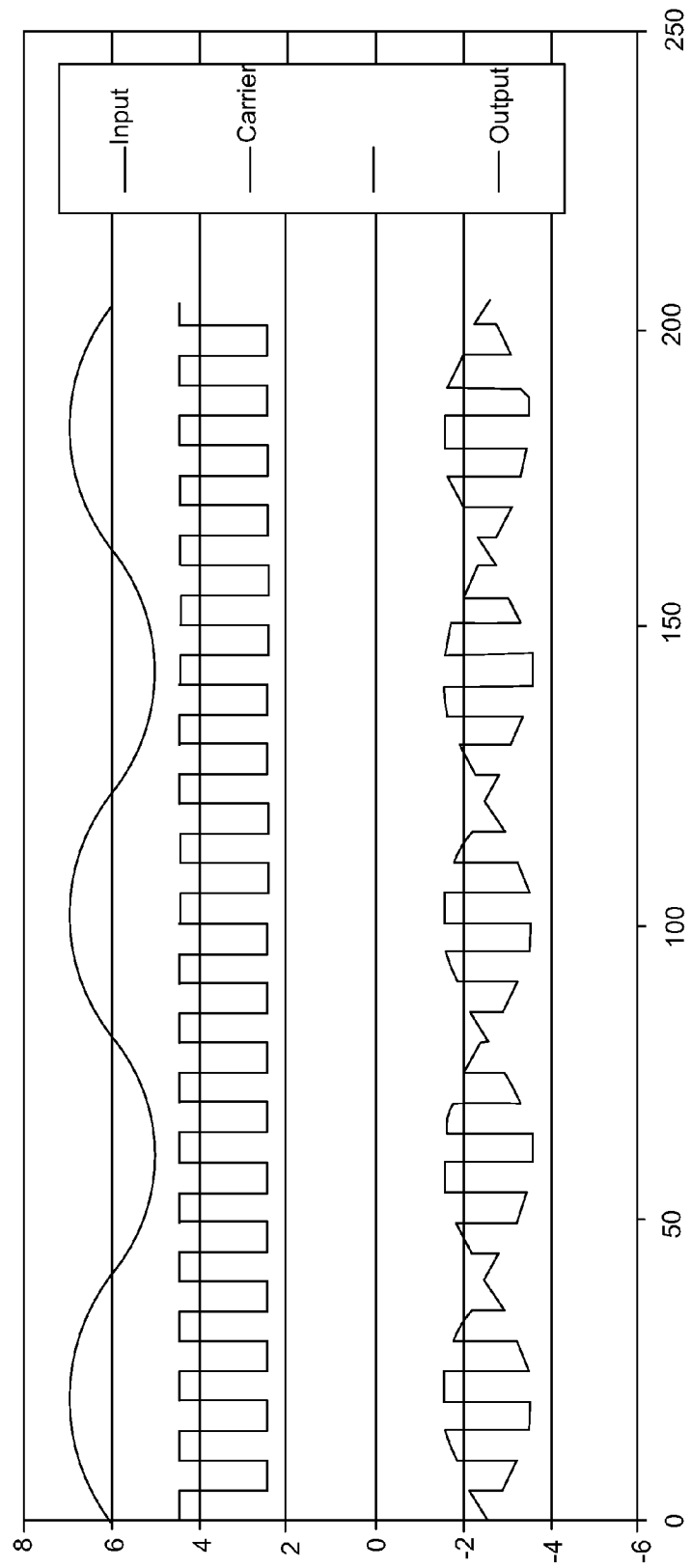
FIG. 4-5 are illustrations of an exemplary square wave carrier and modulated output signal for the analog CMOS switching circuit of FIG. 3.

References to "one embodiment" or "an embodiment" do not necessarily refer to the same embodiment, although they may. Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively, unless expressly limited to a single one or multiple ones. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list, unless expressly limited to one or the other.

"Logic" refers to machine memory circuits, machine readable media, and/or circuitry which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic.

Those skilled in the art will appreciate that logic may be distributed throughout one or more devices, and/or may be comprised of combinations memory, media, processing circuits and controllers, other circuits, and so on. Therefore, in the interest of clarity and correctness logic may not always be distinctly illustrated in drawings of devices and systems, although it is inherently present therein.

The techniques and procedures described herein may be implemented via logic distributed in one or more computing devices. The particular distribution will vary according to implementation.

Definitions

The term "step" as used in regards to signals refers to intervals in the cycle of a periodic signal where the rate of change is "flat", or zero.

The term "approximation" as used in regards to sinusoids refers to enhancing a signal to have characteristics (mathematically, behaviorally) that approach but do not equal those of a sinusoidal signal.

The term "modulation" as used herein has its conventionally understood meaning in signal theory. More particularly, modulation refers herein to amplitude modulation as that term is conventionally understood.

The term "stage" as used herein refers to a portion of a circuit producing an effect on a signal, said effect being propagated from the circuit portion for possible additional processing, or for output as a signal result. A stage may be defined and distinguished by its effects on a signal as opposed to any particular arrangement of components to produce the effect. Or, a stage may be defined by the arrangement of components that produce the effect, or both.

The term "carrier" as used herein refers to a signal having a periodic behavior, including a frequency and duty cycle. The frequency components of the carrier are typically the predominant frequency components (in terms of tuning and propagation) of the modulated signal.

The term "modulated signal" as used herein has its conventional meaning in the art (e.g., a combination of a carrier and an information signal combined with and into the carrier).

The term "square wave" as used herein refers to a periodic signal having two or more steps (of possibly uneven duty cycle) per cycle.

Description of Particular Embodiments

A modulator is described that multiplies a complex (typically audio band, but also potentially FSK) signal by a multi-step carrier to generate a band-shifted replica with reduced carrier harmonics, as might be done for single sideband transmission. Unlike prior techniques, e.g. "Brown", a data signal is first mixed with a square carrier, and then the composite signal is further shaped into a more stepped approximation to a sinusoidal carrier. Brown takes an entirely different approach, encoding the data signal by switching a stepped carrier on and off at timed intervals, not by refining the shape of a composite data/square wave signal (the first modulated signal) into a stepped approximation of a sinusoidal signal (the second modulated signal).

The described modulator is a switched modulator including a first modulation stage combining an information signal with a two-step square wave carrier to form a first modulated signal, and including a second modulation stage refining the first modulated signal into a finer approximation of a sinusoidal wave, to produce a second modulated signal. The finer approximation can be three (3) steps, four (4) steps, or numbers of steps higher than these. The second modulation stage may zero the first modulated signal at an interval around a zero crossing of the first modulated signal, for example by selecting a ground signal for the second modulated signal at this interval (e.g., three step approximation). The switched modulator may instead select (switch) for the second modulated signal a voltage from among taps of a voltage ladder at an interval around a zero crossing of the first modulated signal (e.g., four step approximation). A digitally controlled analog multiplexer (e.g., 2:1, 3:1 or higher) may be used in the second modulation stage where the multiplexer selection signal is synchronous with the two-step square wave that is combined with the information signal in the first modulation stage.

TABLE 1

Equations

| | | |
|---|---|---|
| 1 | $V_{CARRIER} = \sum_{n=1}^{\infty} \frac{1}{n} \sin(2\pi n f_{CARRIER} t)$ | Fourier series representation of a carrier signal |

TABLE 1-continued

Figure 5:
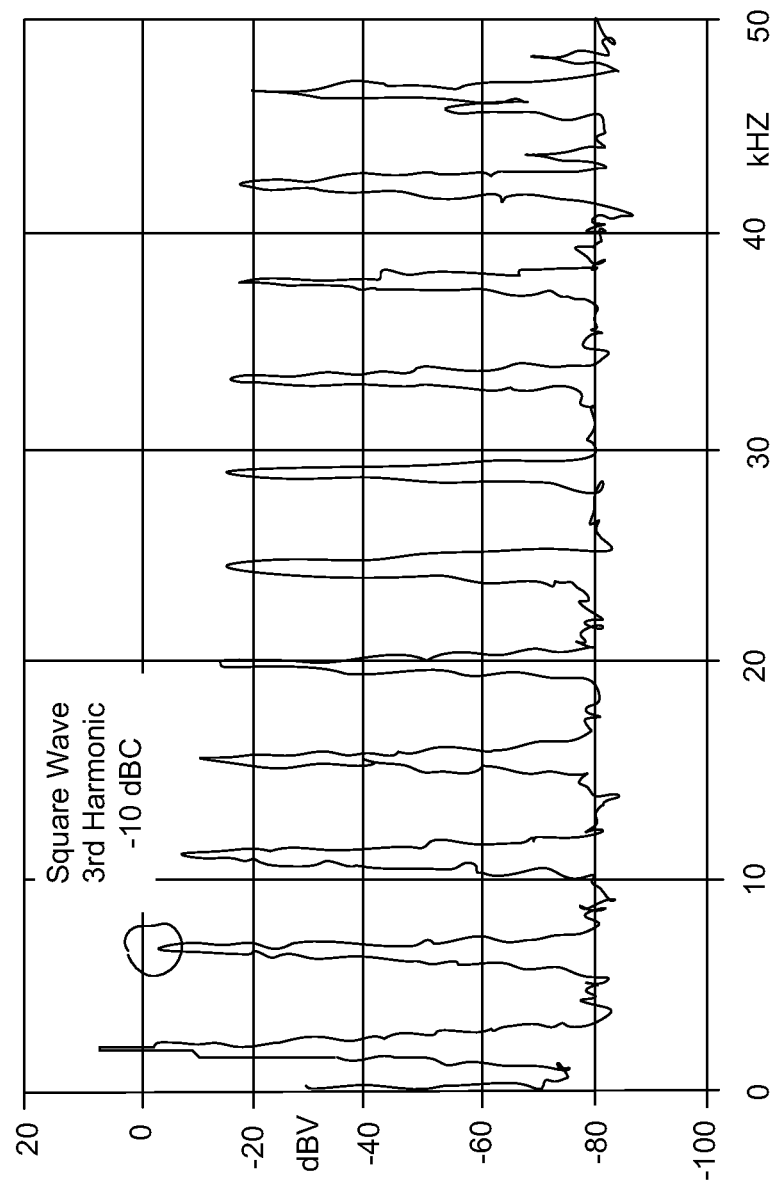

| | Equations | |
|---|---|---|
| 2 | $$V_{OUT}(t) = \frac{V_P}{2}\begin{bmatrix} \cos(2\pi(f_{CARRIER} - f_{SIGNAL})) - \\ \cos(2\pi(f_{CARRIER} + f_{SIGNAL})) + \\ \frac{1}{3}\cos(2\pi(3f_{CARRIER} - f_{SIGNAL})) - \\ \frac{1}{3}\cos(2\pi(3f_{CARRIER} + f_{SIGNAL})) + \\ \frac{1}{5}\cos(2\pi(5f_{CARRIER} - f_{SIGNAL})) - \\ \frac{1}{5}\cos(2\pi(5f_{CARRIER} + f_{SIGNAL})) + \ldots \end{bmatrix}$$ | Partial expansion of Fourier series (1) |
| 3 | $$f(t) = \sum_{n=1}^{\infty} \sin\left(\frac{n\pi}{2}\right)\frac{\sin\left(\frac{n\pi d}{2}\right)}{\left(\frac{n\pi d}{2}\right)}\sin(2\pi f_{CARRIER}t)$$ | Fourier transform of three-step carrier illustrated in FIG. 5. n = the harmonic order d = the duty cycle during each half wave (n$\pi$/2) - toggles the sign of the harmonic; the first harmonic $\pi$/2 is positive, the third harmonic 3 $\pi$/2 is negative, and so on. |
| 4 | $$20*\log\left[abs\left(\frac{\sin(n\pi d)}{n\pi d}\right)\right] = 20*\log\left[abs\left(\frac{\sin\left(\frac{5\pi.666}{2}\right)}{\frac{5\pi.666}{2}}\right)\right] = -15.6 \text{ dB}$$ | Attenuation of 5 harmonic for 66% duty cycle half wave embodiment of (3) |

Figure 6:
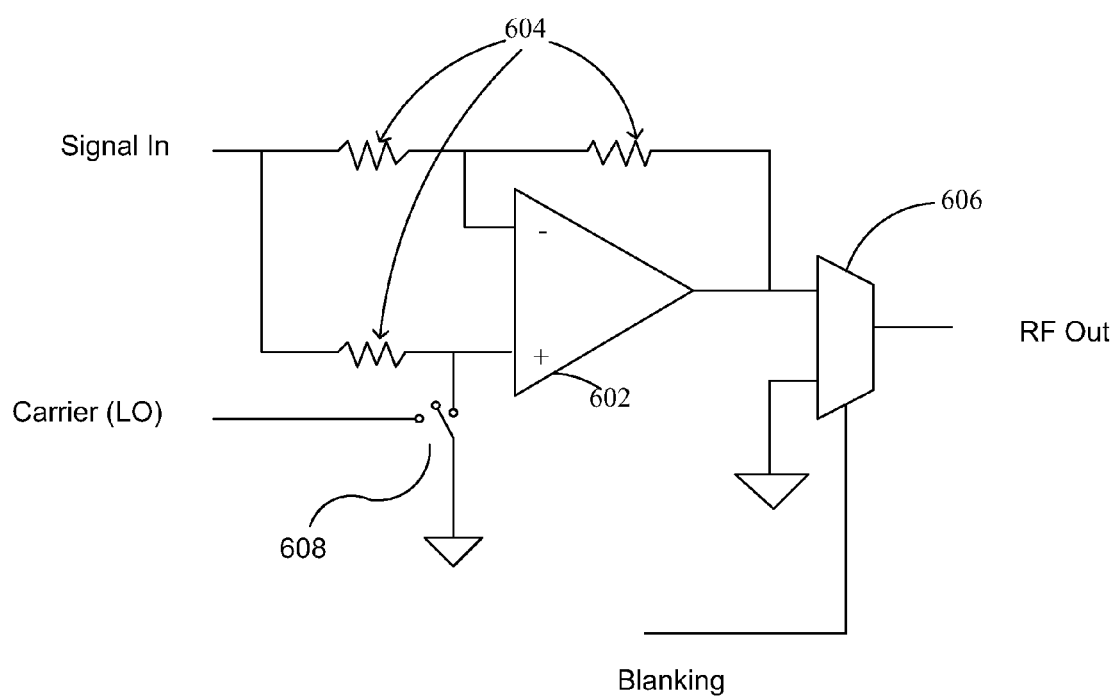
FIG. 6 is an illustration of an embodiment of a circuit to generate a multi-step modulation waveform.
Figure 7:
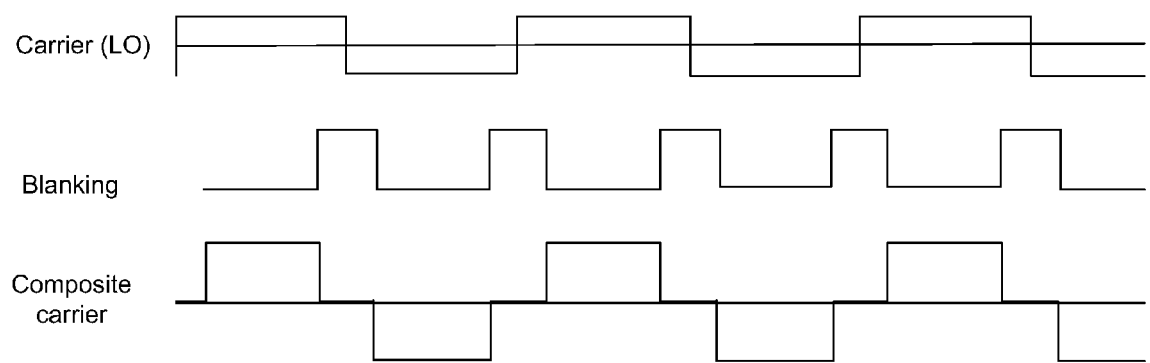
FIGS. 7-9 are illustrations of an embodiment of a multi-step modulation waveform in both the time and frequency domains, generated by the circuit embodiment of FIG. 6.
Figure 8:
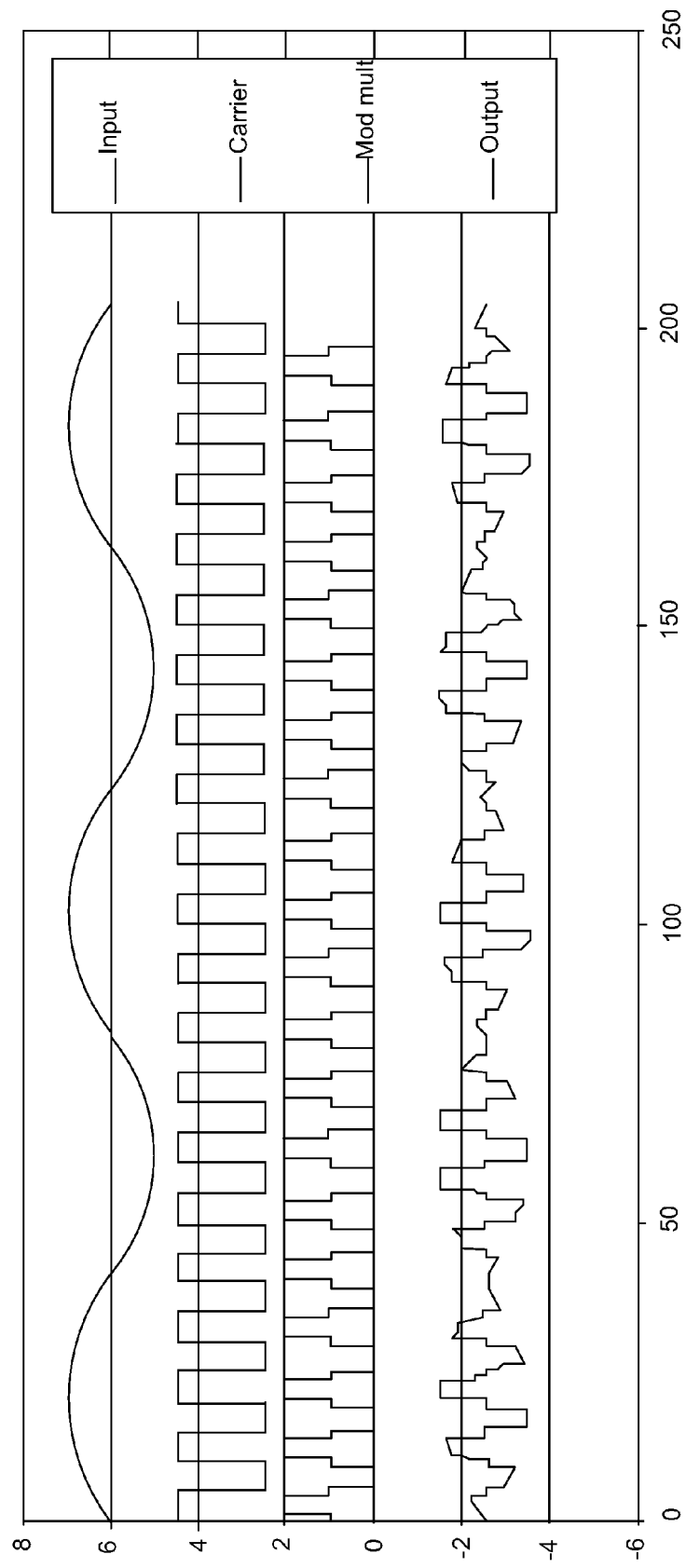
Figure 9:
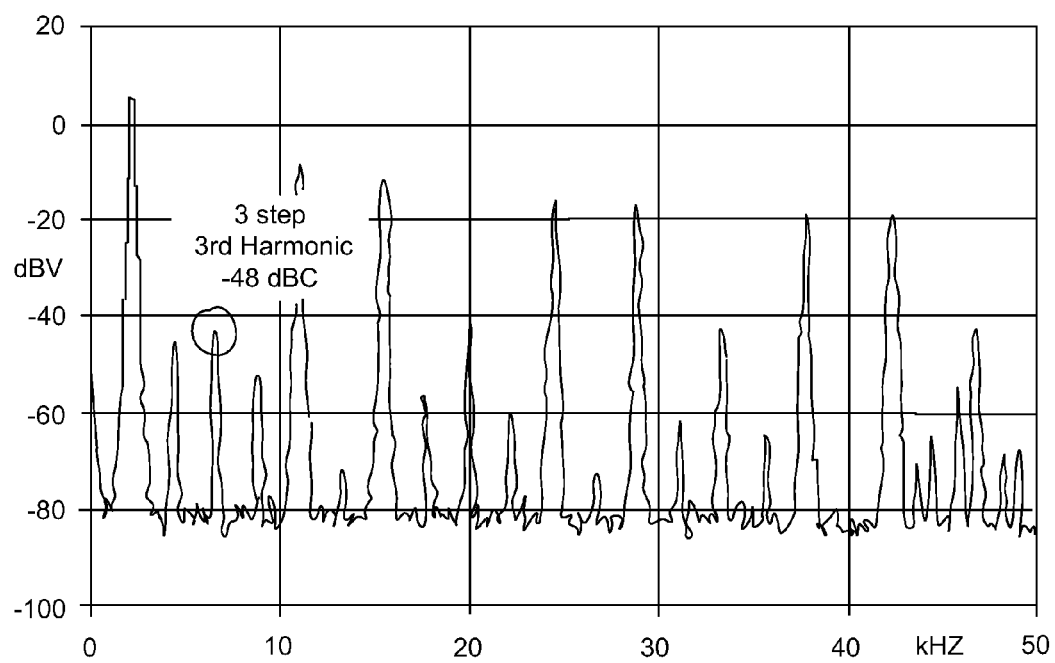

FIG. 6 is an illustration of an embodiment of a circuit to generate a multi-step modulation waveform. The circuit comprises a switched modulator including an amplifier 602 (e.g., a linear analog operational amplifier), a carrier switch 608, resistors 604 (e.g., of equal resistive value of 10K each), and a selector circuit 606, such as a 2:1 digital multiplexer. The switched modulator (i.e., first modulator stage) multiplies the information signal (Signal In) with a square wave carrier to produce a first modulated signal at the output of the amplifier 602. The first modulated signal is further refined to approximate a sinusoidal wave by the second modulator stage which includes selector 606 as controlled by a blanking signal, to produce a second modulated signal RF Out. FIGS. 7-9 are illustrations of an embodiment of a carrier and multi-step modulation waveform in both the time and frequency domains, generated by the circuit embodiment of FIG. 6. The Fourier expansion for a multi-step carrier such as illustrated in FIG. 7 is given in Table 1 by (3). Harmonic suppression occurs when the term sin(n $\pi$d/2) is zero. This occurs when (n$\pi$d/2) is an odd multiple of $\pi$/2, i.e., when d=(1−1/n). For the third harmonic, this happens when d=⅔.

At a duty cycle of d=⅘, the 5th harmonic drops out. Any specific harmonic can be attenuated, almost completely except for "circuit realities," such as inaccurate multiplication in the +1/−1 modulator, and unequal rising and falling rates (rise times) in the modulator output. When the duty cycle is set to 66%, there is still some attenuation at the 5th harmonic. This is calculated from (4) in Table 1, which shows a useful attenuation of the 5th harmonic when the duty cycle is set to 66%.

It is desirable to reduce all of the unwanted harmonics, but reducing the lower order harmonics is of primary concern because it is easier for filters to remove the higher orders. The duty cycle can be designed to reduce both 3rd and 5th harmonics equally or optimally. A duty cycle of 75% (¾ . . . between ⅔ and ⅘) will attenuate both 3rd and 5th harmonics approximately 8.3 dB. This duty cycle is not difficult to generate as a digital control signal.

Figure 10:
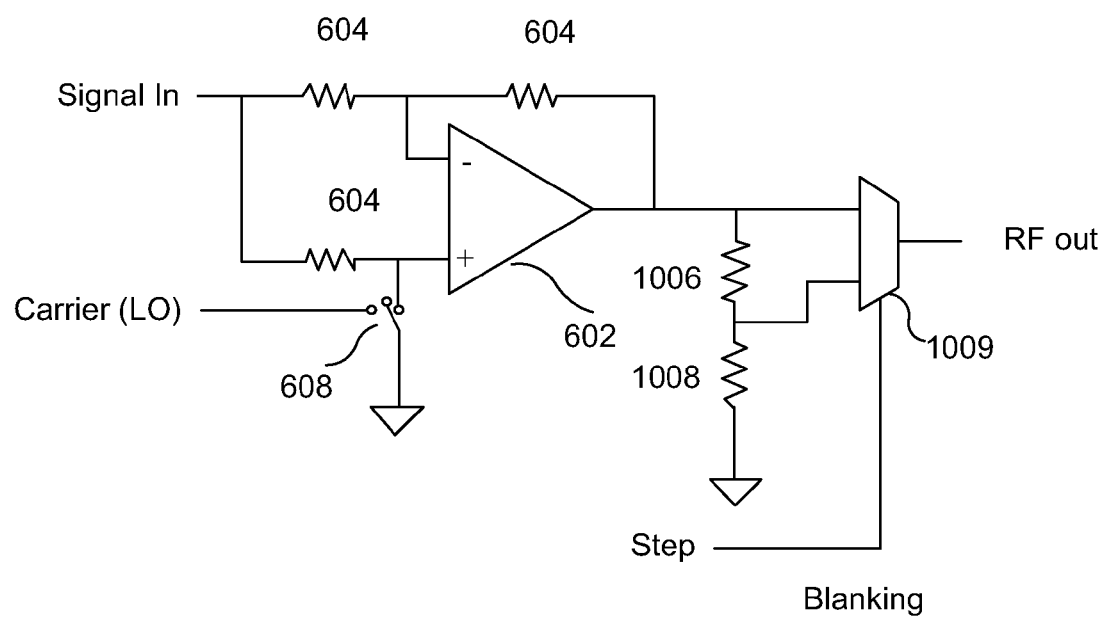
FIG. 10 is an illustration of an embodiment of a circuit to generate a multi-step modulation waveform.

Blanking, or shutting the signal to ground at the zero crossing of the square wave carrier, is illustrated with the signal at ground. "Ground" in actuality may be any fixed reference voltage as long as it is the same as the ground reference for the input signal. For a single-supply system this is typically at about half the analog supply voltage, i.e. Vcc/2. A frequency spectrum of the three step carrier of FIGS. 7 and 8 for d=⅔ is illustrated in FIG. 9. The 3rd harmonic is 48 dB below the fundamental. This is an significant reduction from the 10 dB below fundamental of the square wave. These levels translate to the harmonic level in the modulated output signal. Because the closer the modulated signal is to a sine wave, the lower the harmonics, there are advantages to approximating sinusoidal shapes. A four-step modulated waveform can be developed having a stepped shape that more closely approximates a sinusoidal than the three step embodiment. FIG. 10 is an illustration of an embodiment of a circuit to generate a multi-step modulation waveform that more closely approximates a sinusoidal wave than does the modulated signal produced by the embodiment of FIG. 6. Instead of being blanked at the zero crossing, the shape of the first modulated signal is refined into a stepped approximation of a sinusoidal wave by selecting taps of a voltage ladder 1006, 1008 via selector 1009.

Figure 11:
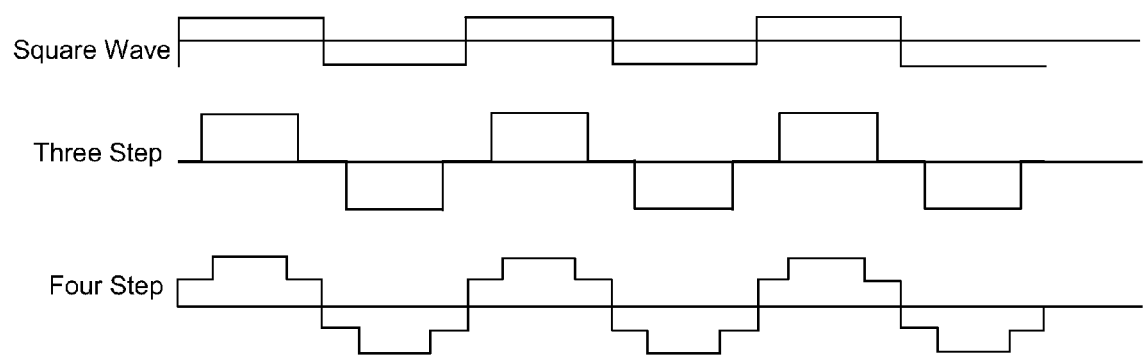
FIGS. 11 and 12(a & b) are illustrations of an embodiment of a multi-step modulation waveform in both the time and frequency domains, generated by the circuit embodiment of FIG. 10.
Figure 12A:
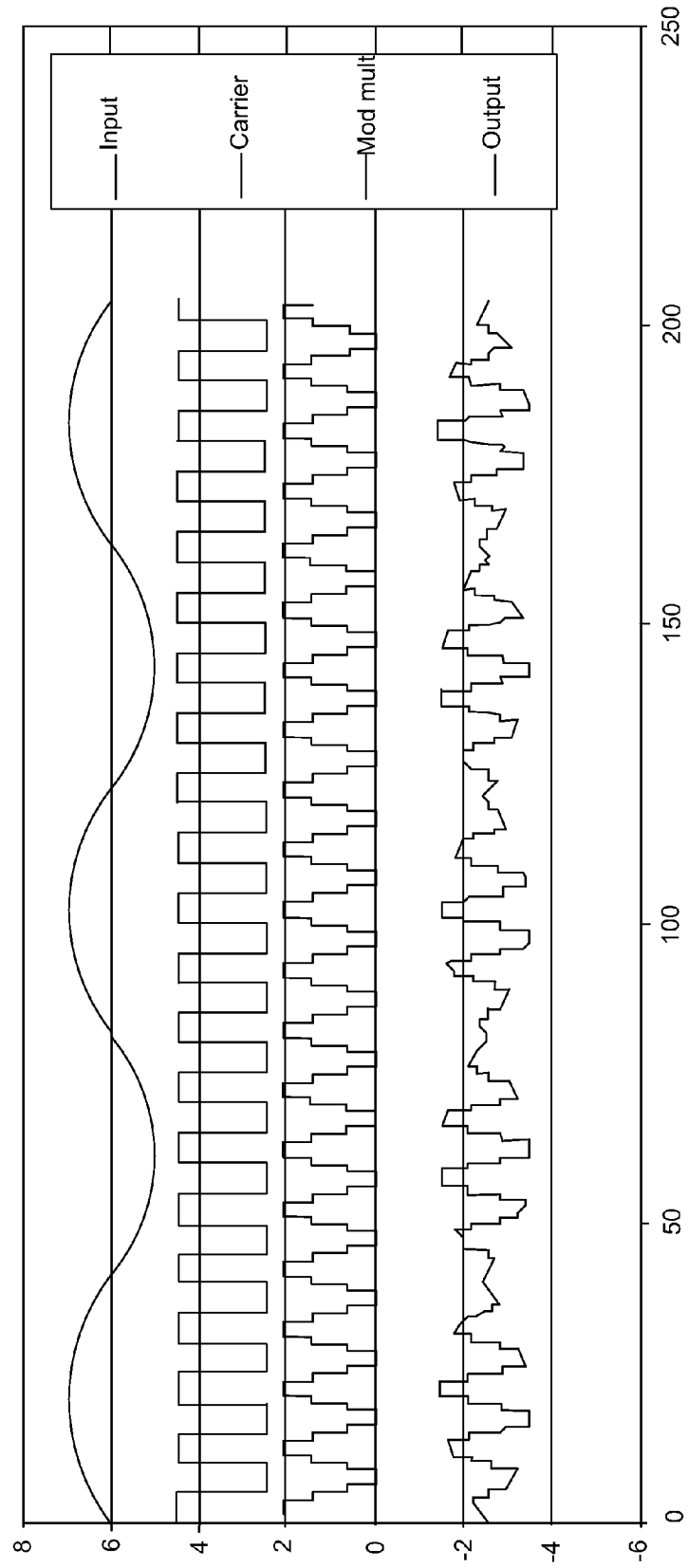
Figure 12B:
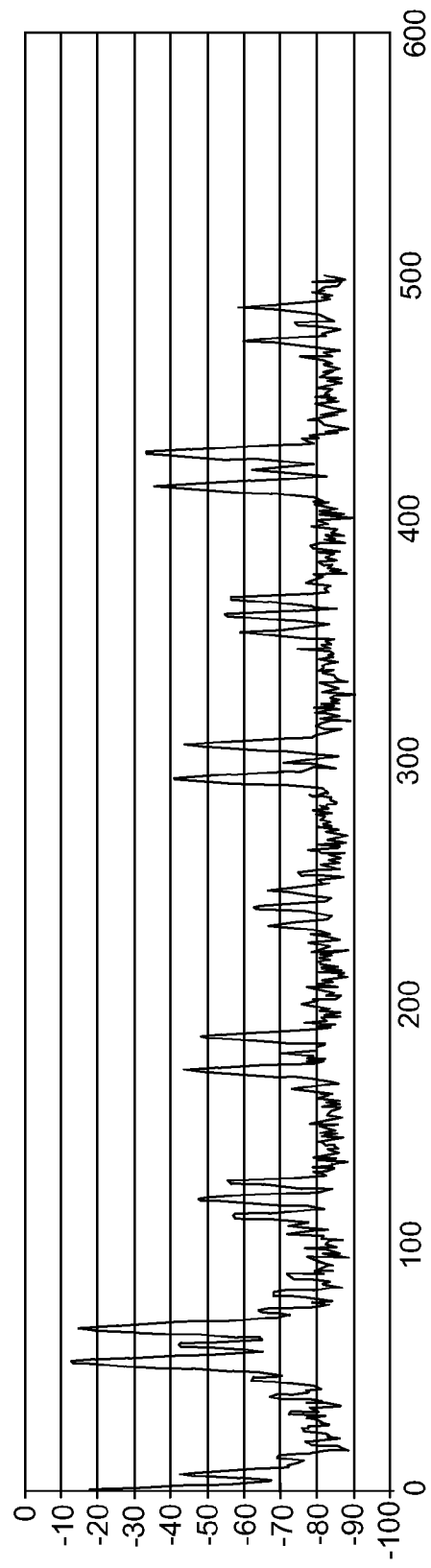

FIGS. 11 and 12(a & b) are illustrations of an embodiment of a multi-step modulation waveform in both the time and frequency domains, generated by the circuit embodiment of FIG. 10. The time domain waveform shows significant reduction in carrier harmonics. The level of attenuation during the step and the width of the step can be configured programmatically. In the illustrated example, the signal is attenuated during the step time to 40% of the peak level. The step occurs for 25% of the time at the start and at the end of the half-cycle.

A square wave modulator exhibits upper and lower sidebands (fcarrier+fsignal) and (fcarrier−fsignal) plus the normal harmonics at a level of 1/n. Using the four-step carrier (FIGS. 10-12 (a&b), considerable suppression of the carrier harmonics is produced. The 3rd harmonic may be an additional 25 dB and the 5th harmonic an additional 14 dB. The sum of the powers of these two carrier harmonics is less than that for the three step waveform, which uses blanking near the zero crossing instead of attenuation near the zero crossing.

Figure 13:
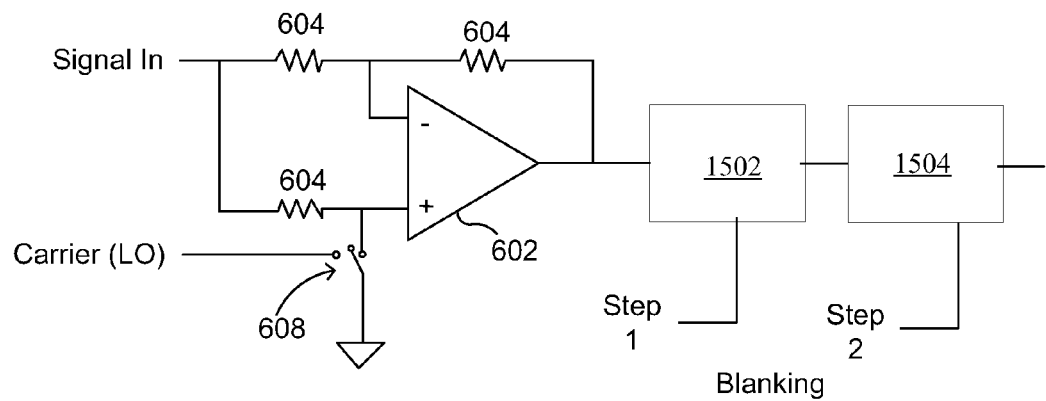
FIGS. 13 and 14 are illustrations of embodiments of circuits to generate a multi-step modulation waveform in configurable stepped approximations to a sinusoidal carrier.
Figure 14:
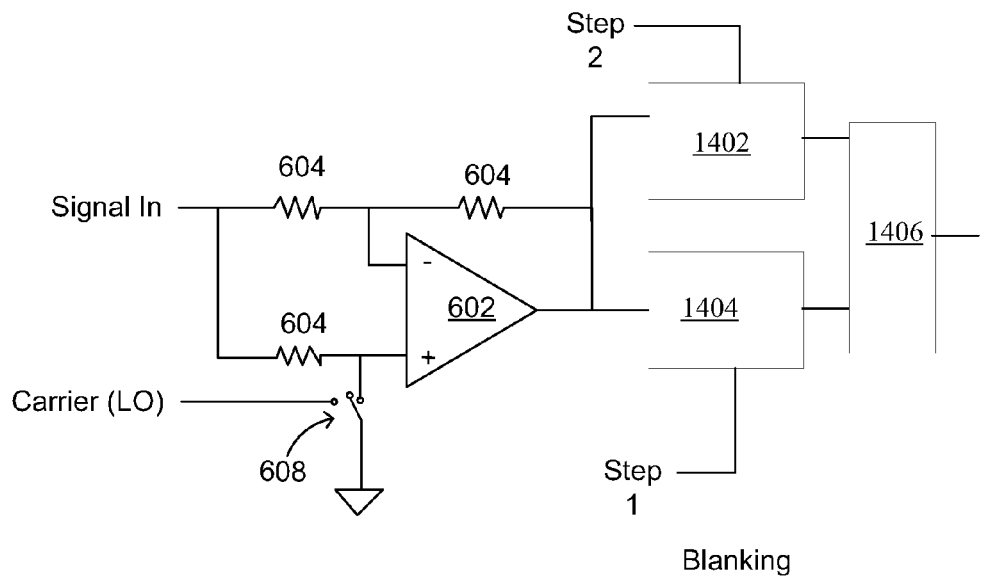

FIGS. 13 and 14 are illustrations of embodiments of circuits to generate a multi-step modulation waveform in configurable stepped approximations to a sinusoidal carrier. In light of the present description and disclosure of circuits and techniques for generating stepped approximations of sinusoidal carrier signals, various levels of stepped approximation for the carrier may be generated by circuits utilizing serial or parallel output stages, in manners known in the art. For example, multiple blanking (or attenuation) stages (1302, 1304 . . . ), or combinations thereof, may be utilized in series as illustrated in FIG. 13, in manners that will now be apparent to those having skill in the art in light of this disclosure. Also multiple blanking (or attenuation) stages (1402, 1404 . . . ), or combinations thereof, may be utilized in parallel and combined as illustrated in FIG. 14, in manners that will now be apparent to those having skill in the art in light of this disclosure. The output of the parallel stages may be combined (e.g., analog multiplication or addition) via a combination stage circuit 1406 the particular design of which will depend upon the implementation.

Figure 16:
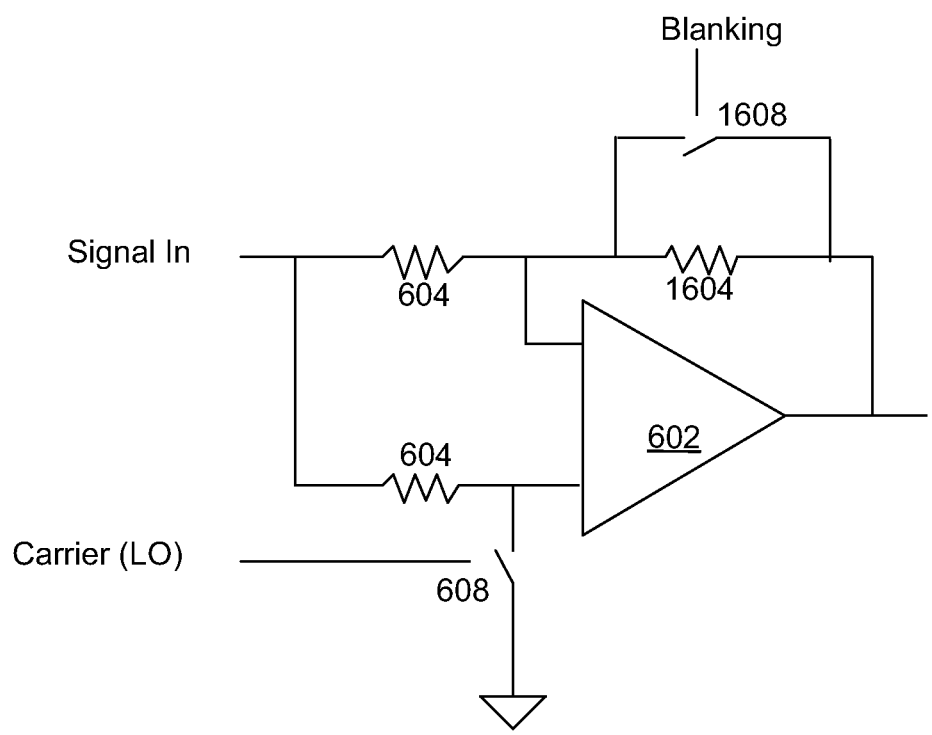
FIG. 16 is an illustration of an embodiment of a circuit to generate a multi-step modulation waveform having reduced circuit size and complexity.

One embodiment that reduces circuit size and complexity is illustrated in FIG. 16. A blanking signal may be applied to create a short circuit at intervals coordinated with the carrier signal input to the first stage, and of controller duration, across a feedback signal path from input to output of the first modulator stage (e.g., the switched modulator). Signals similar to those illustrated in FIGS. 7-9 may be produced by this embodiment of the modulator design.

Figure 15:
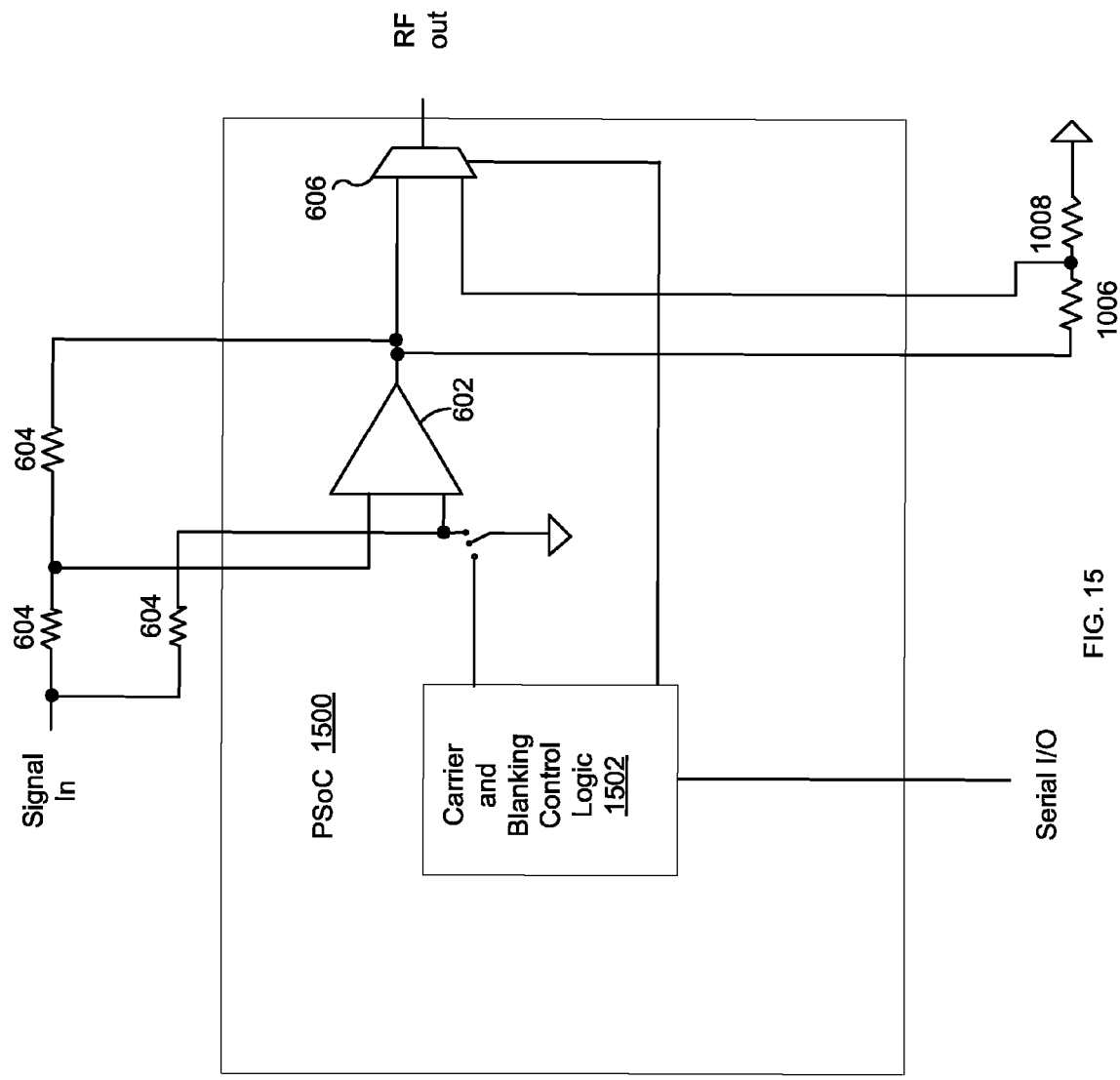
FIG. 15 is an illustration of one embodiment using a Programmable System on a Chip (PSoC).

FIG. 15 is an illustration of an embodiment using a Programmable System on a Chip (PSoC). The PSoC 1500 comprises logic organized into features of a switched modulator as described herein. A linear op amp 602 and multiplexer 606 are controlled by carrier and blanking control logic 1502, which may be programmed via an external serial I/O pin to set, for example, the period and duty cycle of the carrier square wave and blanking signals. External scaling resistors 604, 1006, and 1008 may be included to control other aspects of the modulated signal shape (such as whether the signal is three or four steps). In other embodiments the scaling resistors could be internal to the PSoC or could be replaced, functionally, by logic of the carrier and blanking control 1502.

Implementations and Alternatives

The techniques and procedures described herein may be implemented via logic distributed in one or more computing devices. The particular distribution will vary according to implementation.

Those having ordinary skill in the art will appreciate that there are various logic implementations by which processes and/or systems described herein can be effected (e.g., hardware, software, and/or firmware), and that the vehicle will vary with the context in which the processes are deployed. "Software" refers to logic that may be readily readapted to different purposes (e.g. read/write volatile or nonvolatile memory or media). "Firmware" refers to logic embodied as read-only memories and/or media. Hardware refers to logic embodied as analog and/or digital circuits. If an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations may involve optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof. Several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory.

In a general sense, those skilled in the art will recognize that the various aspects described herein which can be implemented, individually and/or collectively, by a wide range of hardware, software, firmware, or any combination thereof can be viewed as being composed of various types of "circuitry." Consequently, as used herein "circuitry" includes, but is not limited to, electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), circuitry forming a memory device (e.g., forms of random access memory), and/or circuitry forming a communications device (e.g., a modem, communications switch, or optical-electrical equipment).

Those skilled in the art will recognize that it is common within the art to describe devices and/or processes in the fashion set forth herein, and thereafter use standard engineering practices to integrate such described devices and/or processes into larger systems. That is, at least a portion of the devices and/or processes described herein can be integrated into a network processing system via a reasonable amount of experimentation.

The foregoing described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

What is claimed is:

1. A switched modulator, comprising:
a first modulation stage configured to combine an information signal with a square wave carrier to form a first modulated signal; and
a second modulation stage configured to insert additional steps in the first modulated signal to form a second modulated signal that is a finer approximation of a sinusoidal wave than the first modulated signal.

2. The switched modulator of claim 1, further comprising:
the second modulation stage configured to modify the first modulated signal into a three-step approximation of the sinusoidal wave.

3. The switched modulator of claim 1, further comprising:
the second modulation stage configured to modify the first modulated signal into a four-step approximation of the sinusoidal wave.

4. The switched modulator of claim 2, further comprising:
the second modulation stage configured to blank the first modulated signal at an interval around a zero crossing of the first modulated signal.

5. The switched modulator of claim 3, further comprising:
the second modulation stage configured to modify the first modulation signal at an interval around a zero crossing of the first modulated signal with a voltage selected from a plurality of taps of a voltage ladder.

6. The switched modulator of claim 1, further comprising:
the second modulation stage comprising a multiplexer configured to be controlled by a selection signal that is synchronous with a two-step square wave that is combined with the information signal in the first modulation stage to form the first modulated signal.

7. The switched modulator of claim 1, further comprising:
the switched modulator configured to modify the second modulated signal into a sinusoidal wave approximation having a ⅔ half-wave duty cycle.

8. The switched modulator of claim 1, further comprising:
the switched modulator configured to modify the second modulated signal into a sinusoidal wave approximation having a ⅘ half-wave duty cycle.

9. A method of producing a modulated output signal, comprising:
combining an information signal in a first modulator stage with a square wave carrier to form a first modulated signal; and
modifying the first modulated signal in a second modulator stage into a finer approximation of a sinusoidal wave to produce the modulated output signal by inserting additional steps in the first modulated signal.

10. The method of claim 9, further comprising:
modifying the first modulated signal in the second modulation stage into a three-step approximation of the sinusoidal wave.

11. The method of claim 9, further comprising:
modifying the first modulated signal in the second modulation stage into a four-step approximation of the sinusoidal wave.

12. The method of claim 10, further comprising:
blanking the first modulated signal in the second modulation stage at an interval around a zero crossing of the first modulated signal.

13. The method of claim 11, further comprising:
selecting a voltage from among taps of a voltage ladder in the second modulation stage at an interval around a zero crossing of the first modulated signal.

14. The method of claim 9, further comprising:
controlling a multiplexer in the second stage using a selection signal that is synchronous with the square wave that is combined with the information signal in the first modulation stage.

15. A circuit, comprising:
a first modulation stage comprising a switched modulator circuit configured to combine an information signal with a square wave carrier to produce a first modulated signal; and
a second modulation stage configured to receive the first modulated signal and form additional steps in the first modulated signal to produce a second modulated signal.

16. The circuit of claim 15, further comprising:
the second modulation stage configured to form an additional two steps in each half-wave of the first modulated signal.

17. The circuit of claim 15, further comprising:
the second modulation stage configured to form an additional four steps in each half-wave of the first modulated signal.

18. The circuit of claim 16, further comprising:
the second modulation stage configured to blank the first modulated signal at an interval around a zero crossing of the first modulated signal.

19. The circuit of claim 17, further comprising:
the second modulation stage configured to select for the second modulated signal a voltage from one of a plurality of taps of a voltage ladder at an interval around a zero crossing of the first modulated signal.

20. The circuit of claim 15, further comprising:
the second modulation stage comprising a multiplexer configured to be controlled by a selection signal that is synchronous with the square wave that is combined with the information signal in the first modulation stage.

\* \* \* \* \*